United States Patent [19]
Ammon

[11] 3,975,072
[45] Aug. 17, 1976

[54] LOW PROFILE INTEGRATED CIRCUIT CONNECTOR AND METHOD

[75] Inventor: John Preston Ammon, Dallas, Tex.

[73] Assignee: Elfab Corporation, Dallas County, Tex.

[22] Filed: Apr. 15, 1974

[21] Appl. No.: 460,931

[52] U.S. Cl. .............................. 339/17 LC; 29/626; 339/17 CF; 339/176 MP; 339/176 SF
[51] Int. Cl.² ...................... H01R 9/16; H05K 1/10
[58] Field of Search ........ 339/17 C, 17 CF, 176 MP, 339/176 SF, 258 R, 258 RR; 174/68.5; 29/626

[56] References Cited
UNITED STATES PATENTS

| 3,660,726 | 5/1972 | Ammon | 339/17 C X |
| 3,717,841 | 2/1973 | Mancini | 339/17 C X |
| 3,718,895 | 2/1973 | Reynolds et al. | 339/17 CF X |
| 3,732,529 | 5/1973 | Weisenburger | 339/17 CF X |
| 3,754,203 | 8/1973 | Pauza et al. | 339/17 CF |
| 3,796,988 | 3/1974 | Palombella | 339/258 R |
| 3,853,389 | 12/1974 | Occhipinti | 339/258 R X |

Primary Examiner—Roy Lake
Assistant Examiner—E. F. Desmond
Attorney, Agent, or Firm—Crisman & Moore

[57] ABSTRACT

A low profile connector for electrical components having a plurality of leads extending therefrom, such as integrated circuit packages. Rectangular folded contacts, each having an open top lead receiving socket portion, are press fitted into aligned apertures in a substrate with the socket portions lying above the substrate surface. An insulative housing having recesses therein open at each end is laid over the ends of the contacts to receive each one of the socket portions up into a recess in the housing. A component is receiving onto the top surface of the housing with the leads therefrom extending down through the top openings of the recesses into the lead receiving socket portions of the contacts.

24 Claims, 8 Drawing Figures

LOW PROFILE INTEGRATED CIRCUIT CONNECTOR AND METHOD

BACKGROUND OF THE INVENTION

The invention relates to a low profile connector for electrical components and, more particularly, to an integrated circuit connector having contacts press fitted into a substrate and a layover insulator.

Prior art component connectors have generally been of the type wherein contacts are either loaded down into receiving openings in the top of an insulator or wherein contacts are held in a fixed array and the insulator molded around the contacts. In either case, the manufacture of such connectors is a time-consuming, relatively expensive process. Further, the contacts used in prior art component connectors are either generally planar with one or two bowed lead gripping surfaces or are cylindrical, screw machined parts which are expensive both to manufacture and to mount in an insulative housing.

Certain prior art contacts must include transverse shoulder portions which contribute to the overall length thereof and, consequently produce a higher profile connector. When such shouldered contacts are mounted on relatively close centers, the spacing between adjacent contacts may also be quite crowded. The improved contact used in the connector of the present invention is generally shorter than prior art contacts, is adapted to close spacing without excess crowding between adjacent contacts and includes a highly reliable gripping socket portion for retaining the leads of a component.

Prior art integrated circuit connectors have been proposed wherein generally planar contacts having transverse shoulders are press fitted into parallel adjacent rows of holes in a substrate and then separated by insulative strips. For examples in U.S. Pat. No. 3,624,586 to F. T. Inacker entitled Integrated Circuit Connector System and assigned to the assignee of the present application, there is shown such a system for connecting dual inline integrated circuit packages in a "dead bug" configuration, i.e. where the component leads extend upwardly. However, for certain applications it is preferable to mount dual inline integrated circuit components in a "live bug" configuration, i.e. with the component leads extending downwardly and, further, to, provide a live bug connector having a relatively low profile and contacts which are arranged in a closely spaced array with more spacing, and consequently less crowding, between adjacent contacts than with prior art shouldered contacts.

Generally, prior art press fitted contacts have included a solid press fitting neck section having angular edges to slightly deform the walls of the hole and form a tight frictional fit therewith. Certain prior art connector contacts have relied upon a transverse shoulder as a gripping surface for press fitting the contact down into an aperature. Other contacts are press fitted by pulling them through an aperture by the tails from the opposite side to avoid either inclusion of a press fit shoulder or applying force directly to a delicate top portion of the contact. A hollow folded contact having a sturdy socket portion at the top is used in the connector and method of the present invention and is especially adapted for press fitting into cylindrical holes in a substrate by a force applied directly to the top of the contact.

The contact used in the present invention is described and claimed in copending patent application Ser. No. 460,932, filed by J. Preston Ammon on Apr. 15, 1974, entitled "Folded Electrical Contact" and assigned to the assignee of the present invention. The preferred embodiment of the contact includes a lead receiving socket portion and a press-fitting central portion, both of which are preferably formed with planar side walls and are generally rectangular in cross-section and open down the center. The lead receiving socket portion is received up into a recess in a layover insulative housing while the press fitting central portion includes a plurality of longitudinally extending planar surfaces joined by angular edges which engage and slightly deform the material forming the walls of the hole. When press fitted, the planar surfaces of the press fitting central portion of the contact are bowed slightly outwardly to resiliently urge parts of the contact outwardly against the walls of the hole and produce a highly reliable frictional engagement therewith.

SUMMARY OF THE INVENTION

The invention relates to a connector for electrical component leads having contacts press fitted into apertures in a substrate and a layover insulative housing. In other aspects the invention comprises a lead connector for electrical components having conductive leads extending therefrom including a planar substrate having aligned contact receiving holes therein. A plurality of contacts are press fitted into the holes in the substrate and include an elongate socket portion and a central portion having planar side walls. An insulative housing includes recesses having bottom openings of sufficient size to receive the socket portions up into the housing and top openings for receiving component leads. The housing is placed down over the press fitted contacts to substantially enclose the socket portions thereof and to receive conductive leads into the top openings for electrically conductive engagement with the interior of the contact socket portion.

In still another aspect the invention includes a connector assembly for electrical components having conductive leads extending therefrom. The assembly includes contacts and is adapted for mounting upon a planar substrate by press fitting the contacts into contact receiving holes therein. The assembly comprises an insulative housing having a top and a bottom surface and a plurality of recesses extending therebetween. The recesses have bottom openings for receiving contacts and top openings for receiving the conductive leads of components mounted adjacent to top surface of the housing. A plurality of contacts are received into the recesses in the housing through the bottom openings thereof and for receiving and electrically connecting component leads inserted through the top openings in the recesses. The contacts have central press fitting portions extending from the bottom surface of the insulator for press fitting into the holes in a substrate.

BRIEF DESCRIPTION OF THE DRAWING

For a more complete understanding of the present invention and for further objects and advantages thereof, reference may now be had to the following description taken in conjunction with the accompanying drawing, in which.

DETAILED DESCRIPTION

Figure 1:
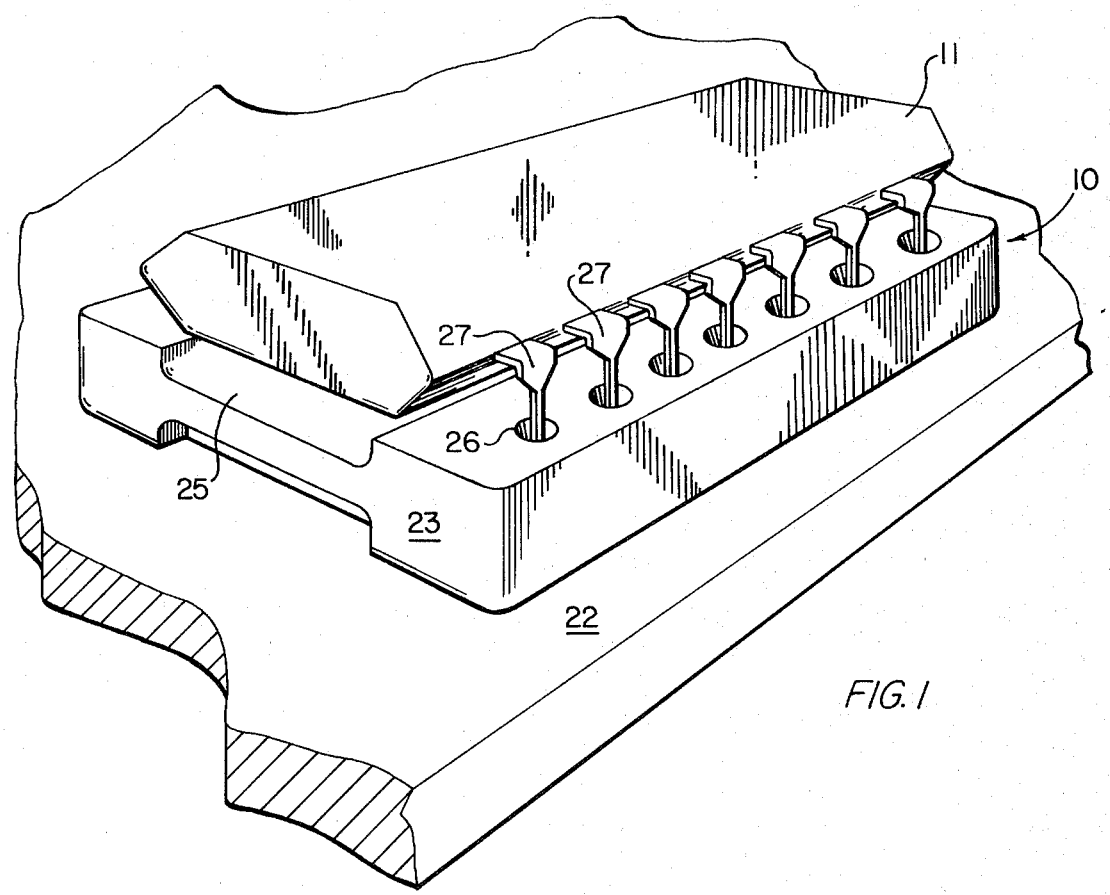
FIG. 1 is a perspective view of the connector of the present invention having an electrical component mounted therein.
Figure 2:
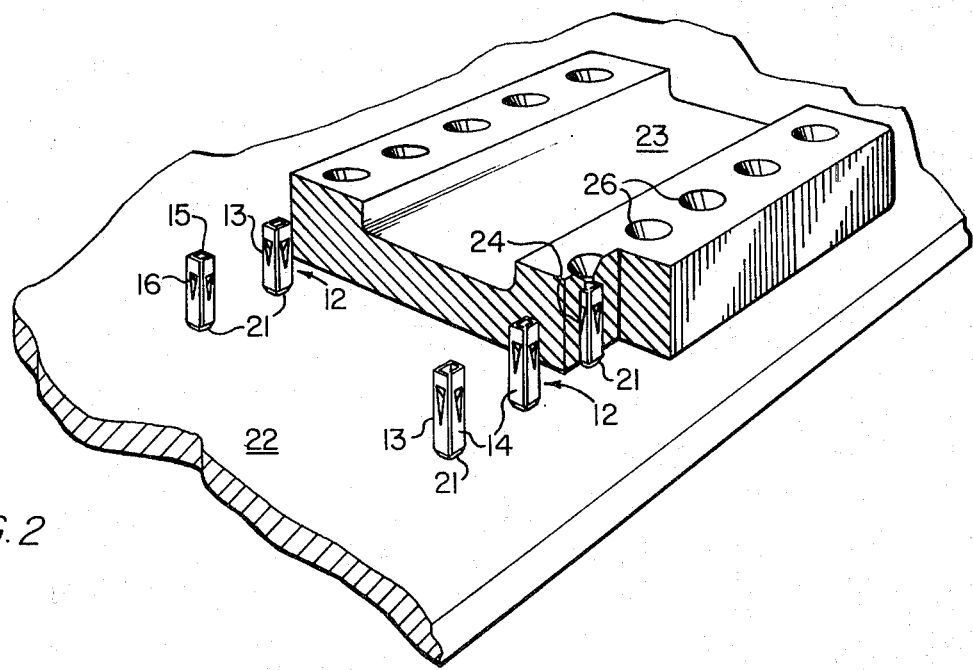
FIG. 2 is a partially cut away view of a connector of the present invention showing the contacts mounted in linear arrays in a substrate.

Referring to FIG. 1, there is shown a low-profile connector 10, constructed in accordance with the invention, having a multi-leaded dual inline integrated circuit package 11 connected therein. As shown in FIG. 2, the connector 10 includes a plurality of contacts 12 each having a generally rectangular, lead-receiving socket portion 13 including four planar side walls 14 and an open top 15 for receiving a component leaad. Each one of the planar sides 14 of the lead receiving portion 13 includes an inwardly and downwardly extending tine 16 positioned for engagement with a component lead to be inserted into the top opening 15. As shown further in FIGS. 7 and 8, each contact 12 also includes a planar sided press-fitting central portion 17. A tapered transition region 18 and an optional channel-shaped tail portion 19 may be provided if desired for wrapped wire terminations. The press-fitting central portion 17 is generally rectangular in cross section and formed with four planar side walls folded from relatively thin sheet material. As will be further evident below, the present configuration of the central press-fitting portion 17 is especially adapted for engaging and resiliently gripping the inner walls of a plated through hole into which the contact has been press fitted.

As shown in FIGS. 1 and 2, the connector 10 comprises a plurality of contacts 12 press fitted into parallel rows of aligned holes 21 formed in a planar substrate 22. An insulative housing 23 including a plurality of recesses 24 is laid over the exposed upstanding ends of the contacts 12 so that the socket portions 13 are received up into the recesses 24 (as shown in FIG. 7).

The substrate 22 is preferably a sheet of printed circuit board material, such as a glass filled epoxy resin (G-10). The housing 23 is preferably molded from an insulative material, such as a plastic or nylon, and may be formed with an optional convection and orientation slot 25 along the top surface thereof. The recesses 24 include circular top openings 26 for receiving the leads 27 of the component 11 to be connected.

The four times 16 of each contact 12 extend inwardly and downwardly and are positioned for resilient outward flexure by the insertion of a component lead into the socket portions 13. Each lead receiving socket portion 13 will preferably accept leads having a maximum transverse dimension on the order of about 8 mils to 30 mils. Even if a lead is bent, twisted or otherwise misoriented, as long as it can be inserted into the open top of the socket portion 13 it will be contacted by one or more of the resilient tines 16. Further, the socket portion 13 will accept and connect any shape of lead (e.g. flat, round, square, oval, etc.) even though the lead is not circular in cross-section.

Figure 7:
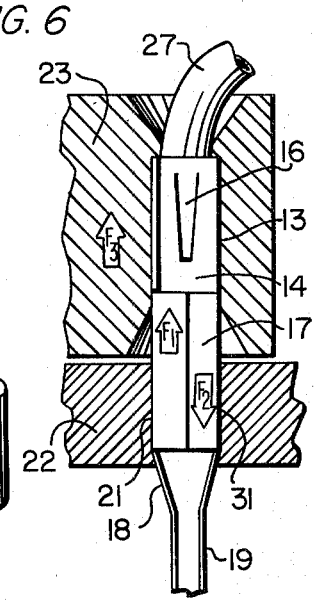
FIG. 7 is a cross-section view of a portion of a connector constructed in accordance with the invention showing a contact fitted into position in both the substrate and the insulative housing.

As shown in FIG. 7, the four folds of the press-fitting central portion 17 produce four planar side walls joined by angular edge sections 31 which extend longitudinally of the contact 12 and play a signifigant role in both electrical and mechanical interconnection with the walls of a plated through hole. The planar sides of the central portion 17 are folded together along a small gap 32 to peripherally enclose the longitudinally extending open area down the center of the contact.

Figure 3:
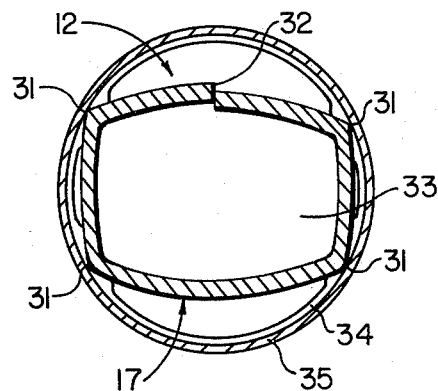
FIG. 3 is a cross-section view of the portion of a contact press fitted into a plated through hole.

Referring now to FIG. 3, there is shown a cylindrical hole 33 having been plated first with an inner layer 34 of malleable material such as copper and an outer layer 35 of malleable material such as tin-lead. The inside diameter of the plated hole 33 is slightly smaller than the outside diagonal dimensions of the folded contact 12 so that after press fitting the contact 12 will be held tight and motionless within the hole 33. When the contact is press fitted into the hole 33, the angular edge sections 31 slightly deform the malleable copper and tin-lead platings 34 and 35 away from the edges to form a tight frictional engagement between the contact and the conductive material on the walls of the hole 33. In the folded contact used in the connector of the present invention, press fitting also deforms the central portion 17 of the contact 12 to close the gap 32 and cause the central portion 17 to assume a more rounded shape and, hence, form a highly reliable electrical and mechanical connection with the conductive walls of the hole 33.

The interfacing frictionally engaging forces between a press fitted contact and the walls of a plated hole is believed to be produced in the prior art by elastic deformation of one surface (i.e., deformation of the plating in the hole when filled by a prior art solid shank) and to be produced with the present contact by elastic deformation of two surfaces (i.e., deformation of both hole plating and the central portion of the contact). After press fitting, the outside surfaces of the central portion of the present contact are slightly bowed and press outwardly against the walls of the hole so that it is less likely that both the material of the walls of the hole and of the contact will be deformed past their elasticity. From FIG. 3, it can be seen that the sidewalls of the central portion of the contact remain generally planar, having been bowed slightly outwardly by press fitting, while the hole remains generally circular to leave some spaces between the two interfacing elements and permit elastic deformation of both elements with continued opposing resilience by each. With the hollow folded contact used in the connector of the present invention, press-fitting deforms both the conductive material on the inner walls of the hole and the resilient sides of the central portion of the contact to provide a high degree of reliability of the mechanical and electrical innerconnections.

Figure 4:
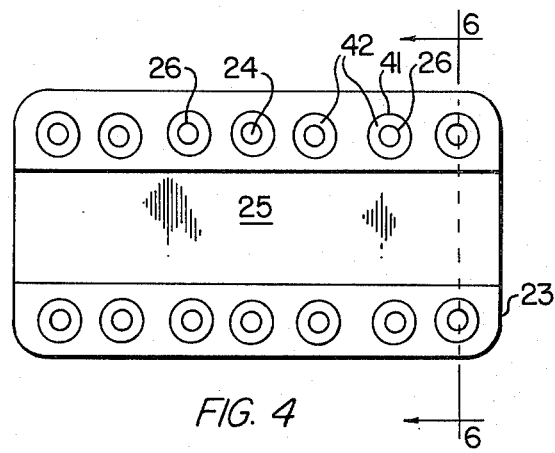
FIG. 4 is a top plan view of an insulative housing used in the invention.
Figure 6:
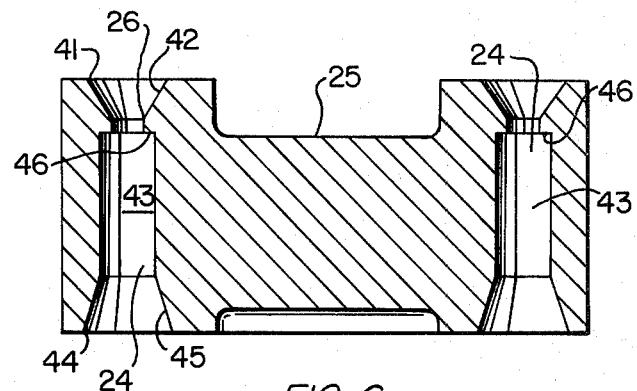
FIG. 6 is a cross-section view of the insulative housing taken about lines 6—6 of FIG. 4.

Referring again to FIG. 4, there is shown a top view of the insulative housing 23 including a plurality of recesses 24 therein. Each one of the circular top openings 26 is surrounded by a concentric outer ring 41 joined to the opening by a conical section 42. As illustrated in FIGS. 4 and 6 the outer ring 41 and the conical section 42 guide bent or slightly misoriented component leads into the opening 26 in the recess 24.

Figure 5:
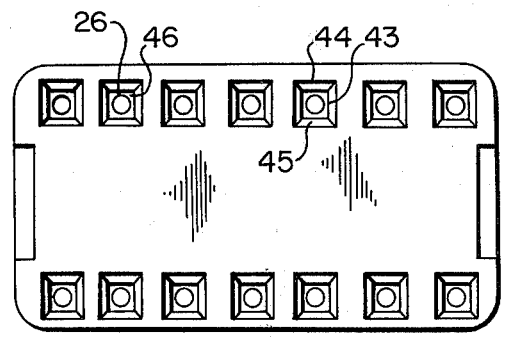
FIG. 5 is a bottom plan view of the insulative housing shown in FIG. 4.

FIG. 5 shows a bottom plan view of the insulative housing 23 illustrating the recesses 24 each of which receives a socket portion 13 of a folded contact 12. As is best shown in FIG. 6, the preferred embodiment of each of the recesses 24 include an elongate central rectangular cavity 43 which is sized to snugly receive the rectangular socket porion 13 of a contact 12. Moreover, the four planar folded side walls 14, of each socket portion 13, are formed so that a side wall adjacent the edge of peripheral closure extends outwardly, slightly non-parallel to its opposite side wall, leaving a slight gap along the edge of closure. The opposed internal walls of the rectangular cavity 43 are parallel to one another so that insertion of a contact socket portion 13 up into the cavity 43 forces the two side walls adjacent the edge of closure to butt together, thereby closing the slight gap and causing the side walls 14 to press resiliently outwardly against the internal walls of the cavity and hold the socket portion snugly within the cavity 43. The lower entrance to each rectangular cavity 43 is formed by a somewhat larger rectangular opening 44 for guiding a contact onto four inwardly directed beveled surfaces 45 which collectively taper into the rectangular cavity 43. The inside top surface of each rectangular cavity 43 is formed by a flat seating region 46 which surrounds and is directly beneath a circular top opening 26. As illustrated in FIG. 7, when a contact socket portion 13 is received up into a cavity 43 the flat top edge of the socket abuts the seating region.

Figure 8:
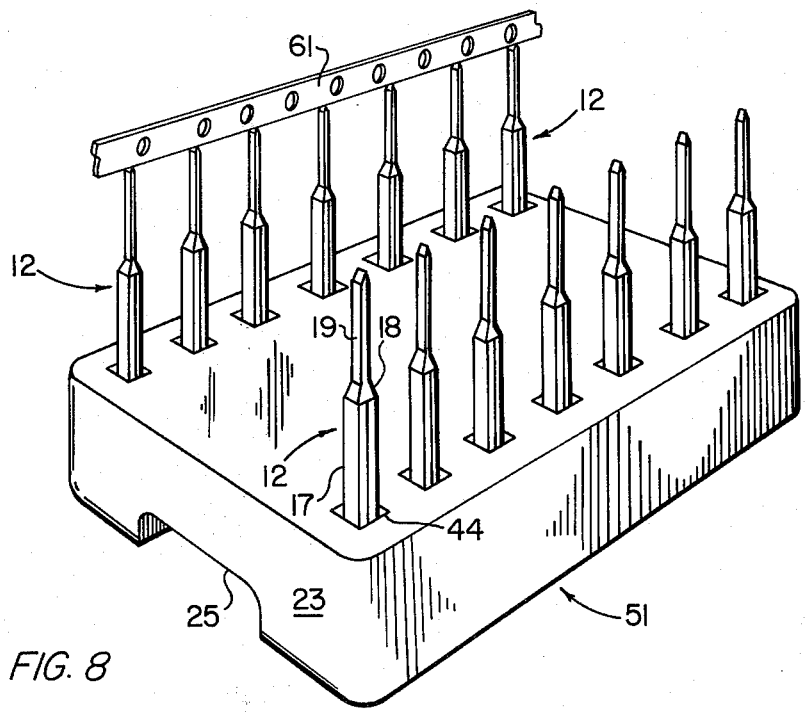
FIG. 8 is a bottom perspective view of a connector constructed in accordance with the invention comprising an insulative housing having a plurality of contacts fitted therein and ready for press fitting into apertures in a substrate.

In FIG. 8, one embodiment of a contemplated assemblage 51 is shown with a plurality of contact terminals 12 having the socket portions thereof inserted into the bottom openings 44 in the insulative housing 23. One row of contacts 12 are shown still attached by their tails to a common support strip 61 illustrating that a plurality of contacts may be loaded into an insulator simultaneously and then the strip removed. The contact terminals 12 are held in place by frictional engagement of the outside walls 14 of the socket portions 13 with the inside walls of the cavity 43. The integrated circuit connector assemblage 51, including the insulator 23 and the protruding contacts 12, is complete and ready to be installed in a substrate, such as a printed circuit board, by press-fitting the central portion 17 of the contacts 12 down into parallel rows of aligned apertures. Press-fitting of the contacts 12 into apertures may be effected by a force applied directly to the top surface of the insulator 23 and thus transmitted by the flat seating regions 45 to the flat upper peripheral edges of the contact socket portions 13. The insulator 23 also acts as a "stop" to prevent overinsertion or crushing of the contacts 12 when press-fitting them into apertures. This structural arrangement (shown in FIG. 8) will enable an assemblage of insulator and contacts to be installed at a remote location by simply press-fitting the assembly into position in a substrate.

The connector of the present invention can be assembled in several different manners. First, for example, if the contacts are formed with a common support strip connecting the tails (as shown in FIG. 8) strips of contacts can be inserted simultaneously into aligned recesses in one or more inverted insulators, the support strips removed and all the contacts simultaneously press-fitted into apertures in a substrate by a force applied to the top of the insulator. Second, if the contacts are formed with a common support strip connecting the socket portions, strips of contacts can be inserted into aligned rows of holding cavities in a fixture, and the support strip removed. The contacts are then loaded from the fixture into the aligned recesses in one or more inverted insulators (as shown in FIG. 8) and finally press fitted simultaneously into apertures in a substrate by a force applied to the top of the insulator. Finally, when the contacts are formed with a common support strip connecting the socket portions, the contacts can be press fit into rows of aligned apertures in a substrate, the support strip removed and the socket portions of the contacts received into recesses in the insulative housing as it is laid over the contacts.

The contacts used in the present invention may be assembled into a substrate in accordance with U.S. Pat. No. 3,676,926 entitled "Method for Manufacturing Connector Terminals" and used to form a multilayer printed circuit board in accordance with U.S. Pat. No. 3,660,726 entitled "Multi-Layer Printed Circuit Board and Method of Manufacture".

Referring again to FIG. 7, there is shown a partially cut away cross section view of a contact fitted into both a recess 24 in an insulative housing 23 and a plated through hole 21 in a substrate 22. Three different force vectors F1, F2 and F3 are shown on FIG. 7 with their directions indicated by arrowheads. F1 is the force required to insert a contact 12 into the cavity 43 located within the recess 24 of the insulative housing 23; F2 is the force required to press fit the central portion 17 of a contact 12 down into a hole 21 in a substrate 22; and F3 is the force required to remove the insulative housing 23 from the contacts while leaving all the contacts in position in the substrate 22. The force F1 is generally the smallest force of the three and is only large enough to retain the contacts within the recess 24 during shipment or production handling, typically on the order of 1–3 pounds per contact position. The force F1 can be varied by changing either the outside dimensions of the socket portion 13 or the inside dimensions of the cavity 43 to vary the frictional interference therebetween, as discussed above. The force F2 is the largest of the three and is limited only by the crush strength of the contact 12 and by the crush strength of the insulative material forming the housing 23. Each of these crush strengths are preferably about 40 pounds per contact position. When the contacts 12 are press fitted into aperatures after loading into the insulator 23 (as shown in FIG. 8), the preferable design range for force F2 is about 8– 20 pounds per contact position. The force F3 is approximately the same as the force F1 but is generally slightly greater due to interferences from slight misalignments. In any case, F3 will be less than F2 so that the insulator 23 can be removed from the socket portions 13 without removing the contacts 12 from the substrate 22. The force values given are, of course, functions of particular materials and thicknesses employed and are intended as being merely illustrative of a typical embodiment.

The integrated circuit connector embodiment of the present invention is a low profile connector due to elimination of the length of prior art solid contacts previously used for a "press-fit shoulder". Instead, the folded contact used in the present invention posesses substantial longitudinal rigidity and is press fitted into a substrate by a force applied directly to the top of the contact. The elimination of a press-fit shoulder in the folded contact also prevents interference between neighboring contacts and permits arrays having a larger spacing between adjacent contacts.

The structural and procedural aspects of the invention have been described above with reference to certain preferred embodiments of the invention, which have been selected from the many embodiments which the invention might take, for purposes of example and illustration. Persons skilled in the art and technology to which this invention pertains will recognize that the specific structures and procedures described may be modified or altered somewhat while still utilizing the advances and improvements provided by the invention. Accordingly the foregoing description should be regarded as explanatory and illustrative, rather than limiting of the scope of the invention.

What is claimed is:

1. A connector for electrical components having conductive leads extending therefrom, comprising:
   a planar substrate having aligned contact receiving holes therein;
   a plurality of longitudinally rigid contacts having a central portion for press-fitting into the holes in said substrate, said contacts each having a socket portion, said socket portion having a flat top edge surface and a top opening for receiving a component lead; and
   a removable insulative housing having a plurality of recesses formed therein with bottom openings of sufficient size to receive the socket portions up into said recesses, top openings for receiving component leads, and a generally flat seating region within each recess surrounding each top opening, said socket portions being placed up into said recesses to substantially enclose the socket portions thereof with the flat top edge surface of each contact in an abutting relationship with the generally flat seating region within each respective recess, and the central portion of each contact protruding from said bottom openings of said housing to transmit force applied to the top surface thereof to said contacts to press-fit the central portions thereof into said apertures and to receive component leads into the top openings for electrically conductive engagement with the interior of each respective contact socket portion.

2. A connector for electrical components having conductive leads extending therefrom, as set forth in claim 1 wherein:
   each of said contact socket portions, including the flat top edge surfaces thereof, are rectangular in cross section; and
   each of said recesses, including the generally flat seating region at the top of each, comprises a rectangular cavity for receiving a contact socket portion therein.

3. A connector for electrical components having conductive leads extending therefrom, as set forth in claim 1 wherein each of said contacts comprises:
   a sheet of pliant conductive material formed into a centrally open contact being folded about at least two longitudinal lines to form said central portion and said lead receiving socket portion having a plurality of generally planar walls with the top edges of said socket portion lying in a generally common plane substantially perpendicular to the axis of the contact.

4. A connector for electrical components having conductive leads extending therefrom, as set forth in claim 3, wherein:
   said sheet is folded about at least three longitudinal lines to form a contact having four planar sides generally rectangular in cross section.

5. A connector assembly for electrical components having conductive leads extending therefrom, said assembly including contacts and being adapted for mounting upon a planar substrate by press fitting the contacts into contact receiving holes therein, said assembly comprising:
   a removable insulative housing having a top and a bottom surface and a plurality of recesses extending therebetween, said recesses having bottom openings for receiving contacts into said recesses, top openings for receiving into said recesses the conductive leads of components mounted adjacent the top surface of the housing and a generally flat seating region within each recess surrounding each top opening and adapted for transferring pressure applied to the top surface of the housing from said housing to the top edge surface of each contact within a recess; and
   a plurality of contacts each including an open top socket portion received into a recess in said housing, through the bottom opening thereof, and for receiving and electrically connecting a component lead inserted through the top opening in the recess, said contacts having central press-fitting portions extending from the bottom surface of the insulator for press fitting into said holes in a substrate, and a flat top edge surface forming the upper end of the open top socket portion to abut the seating region within each insulator recess and transmit force applied to the top surface of the housing for press-fitting portions of each contact into said holes in a substrate.

6. A connector assembly as set forth in claim 5 wherein each of said contacts comprises a sheet of bendable conductive material folded about a plurality of parallel longitudinally extending lines to form:
   a socket portion having a plurality of planar sidewalls, an open top for receiving and conductively engaging a component lead, and flat top edge surfaces; and
   a central portion adjacent said socket portion having planar sidewalls and edge sections for press fitting into an aperture in said planar substrate to hold said contact rigidly within said substrate.

7. A connector assembly as set forth in claim 6 wherein:
   each of the recesses in said housing includes a cavity having planar wall surfaces for receiving the walls of the socket portion of each cavity.

8. A method for assembling an electrical component connector including a removable insulative housing having recesses extending between a top and a bottom surface thereof, said recesses including a generally flat seating region therein, said method comprising:
   inserting lead receiving contacts having press fittable portions including generally flat top edge surfaces into bottom openings in the recesses in said housing to abut the contact edge surfaces of each contact against each recess seating region and leave a portion, including said press fittable portion, of each contact extending from the bottom surface of the housing;

positioning said connector with the depending portions of the contacts therein above and in alignment with apertures in a substrate;

applying a force to the top surface of said housing to transmit said force from each of said recess seating regions to the top edge surfaces of each contact and press fit the depending contacts rigidly into the apertures in the substrate, while permitting the insulator to be removed from the rigidly mounted contacts following mounting by applying an upward force thereto, said upward force being required for removal of the housing being substantially less than the force against the top surface of the housing required for press-fitting the contacts into apertures in the substrate.

9. A method for assembling an electrical component connector as set forth in claim 8 wherein the substrate apertures are plated with a malleable material, contacts are open down the center and the portion of the contacts extending from the bottom surface of the housing includes a plurality of longitudinally extending planar sidewalls defining angular edge sections and said force applying step includes:

deforming the malleable material within said substrate apertures to hold said contact firmly within said substrate.

10. A connector for electrical components having conductive leads extending therefrom, comprising:

a substrate having a plurality of aligned generally circular apertures formed therein;

a conductive plating formed on the internal walls of said apertures;

a plurality of folded metal contacts each having an axially extending passageway generally open at both ends and each including, a socket portion open at the top for receiving and conductively engaging the lead of an electrical component inserted therein, said socket portion having a generally closed periphery and a flat top edge surface, and a central portion connected to saaid socket portion and being press-fitted into one of said plated aperatures, said central portion having a plurality of planar sidewalls including angular edges therebetween for deforming engagement with the plated material on the walls of the aperture to hold said contact rigidly in position within said aperture; and a removable insulative housing having a plurality of recesses formed therein with bottom openings of sufficient size to receive the socket portions up into said recesses, top openings for receiving component leads and generally flat seating regions within each recess surrounding each top opening, said housing being placed down over said press-fitted contacts to substantially enclose the socket portions thereof, abut the flat top edge of each contact and the flat seating region of each recess, and to receive conductive leads into the top openings for electrically conductive engagement with the interior of the contact socket portion.

11. A connector for electrical components as set forth in claim 16 wherein:

said contact socket portions also each includes a plurality of planar sidewalls.

12. A connector for electrical components as set forth in claim 11 wherein:

the recesses in the insulative housing each include a cavity having a plurality of planar sidewalls for receiving a contact spocket portion.

13. A connector for electrical components as set forth in claim 12 wherein said cavities are smaller than said top recess openings and are separated therefrom by a seating region.

14. A connector for electrical components as set forth in claim 12 wherein:

each of said contacts comprises four planar wall surfaces positioned at substantially right angles to one another to form a contact of generally rectangular cross section; and each of said recess cavities include four planar walls of generally rectangular in cross section for receiving said contacts.

15. A connector for electrical components as set forth in claim 14 wherein each contact also includes:

a channel shaped tail portion connected to and narrower than said central portion, said tail having three planar sidewalls open along one side to resiliently receive wire interconnections wrapped circumferentially about said tail, and a transition region connected between said central portion and said narrower tail portion.

16. A connector for electrical components having conductive leads extending therefrom, comprising:

a planar substrate having aligned contact receiving holes therein;

a plurality of contacts having a central portion press fitted into the holes in said substrate, said contacts each having a socket portion above said substrate including a resilient tine formed in a side wall of said socket portion, said tine extending into the socket to electrically an mechanically engage a component lead inserted therein, said socket portions also having a generally closed periphery, a flat top edge surface and a top opening for receiving a component lead; and an insulative housing having a plurality of recesses formed therein with bottom openings of sufficient size to receive the socket portions up into said recesses, top openings for receiving component leads, and a generally flat seating region within each recess surrounding each top opening, said housing being placed down over said press-fitted contacts to substantially enclose the socket portions thereof with the flat top edge surface of each contact in an abutting relationship with the generally flat seating region within each respective recess, said housing to receive component leads into the top openings for electrically conductive engagement with the interior of each respective contact socket portion.

17. A connector assembly for electrical components having conductive leads extending therefrom, said assembly including contacts and being adapted for mounting upon a planar substrate by press-fitting the contacts into contact receiving holes therein, said assembly comprising:

an insulative housing having a top and a bottom surface and a plurality of recesses extending therebetween, said recesses having bottom openings for receiving contacts into said recesses, top openings for receiving into said recesses the conductive leads of components mounted adjacent the top surface of the housing and a generally flat seating region within each recess surrounding each top opening an adapted for transferring pressure applied to the top surface of the housing from said housing to the top edge surface of each contact within a recess; and a plurality of contacts each including an open top socket portion received into a recess in said housing, through the bottom opening thereof, and a flat top edge surface forming the upper end of the open top socket portion to abut the seating region within each insulator recess and transmit force applied to the top surface of the housing for press fitting portions of each contact into said holes in a substrate, each of said contacts also including a sheet of bendable conductive material folded about a plurality of parallel longitudinally extending lines to form a socket portion having a plurality of planar sidewalls and an open top for receiving a component lead, each planar wall of said socket portion including a resilient tine extending inwardly and downwardly into the socket to electrically and mechanically engage a component lead inserted therein, and a central portion adjacent said socket portion having planar sidewalls deformable upon press fitting into an aperture in said planar substrate to hold said contact firmly within said substrate.

18. A method for assemblying an electrical component connector including an insulative housing having recesses extending between a top and a bottom surface thereof, said recesses including a generally flat seating region, said method comprising:

simultaneously inserting a plurality of lead receiving contacts having generally flat top edge surfaces and being joined by a common support strip into bottom openings in the recesses in said housing to abut the contact edge surfaces of each contact against each recess seating region and leave each portion of each contact joined by said common support strip extending from the bottom surface of the housing;

removing said common support strip to electrically and mechanically separate each of said inserted contacts from one another;

positioning said connector with the depending portions of the contacts therein above and in alignment with apertures in a substrate;

applying a force to the top surface of said housing to transmit said force through each of said recess seating regions and the top edge surfaces of each contact and press fit the depending contacts into the apertures in the substrate.

19. A connector for electrical components having conductive leads extending therefrom, comprising:

a substrate having a plurality of aligned generally circular apertures formed therein;

a conductive plating formed on the internal walls of said apertures;

a plurality of folded metal contacts each having an axially extending passageway generally open at both ends and each including;

a socket portion open at the top and including a plurality of planar sidewalls having a resilient tine extending inwardly and downwardly into the socket to electrically and mechanically engage a component lead inserted into the top opening;

a central portion connected to said socket portion and being press fitted into one of said plated apertures, said central portion having a plurality of planar sidewalls including angular edges therebetween for deforming engagement with the plated material on the walls of an aperture to hold said contact rigidly in position within said aperture; and an insulative housing having a plurality of recesses formed therein with bottom openings of sufficient size to receive the socket portions up into said recesses and top openings for receiving component leads, said housing being placed down over said press-fitted contacts to substantially enclose the socket portions thereof and to receive conductive leads into the top openings for electrically conductive engagement with the interior of the contact socket portion.

20. An electrical connector assembly adapted for structural mounting to a substrate having contact receiving apertures formed therein, comprising:

a removable insulative housing having an upper and a lower surface and a plurality of recesses formed therethrough in spaced alignment with said apertures, each of said recesses having a top opening and a bottom opening, said bottom opening being larger than said top opening to define a generally flat load bearing seating region within each recess surrounding the underside of each top opening;

a plurality of elongate longitudinally rigid contacts having a portion thereof received up into the bottom openings of said recesses and a portion thereof protruding from the lower surface of said housing, the outer peripheral surfaces of the portion of each contact within a recess being sized for light interfering engagement with the inner peripheral surfaces of its associated recess to employ the insulative housing as a holding fixture for said contacts, each of said contacts having a central opening in axial alignment with the top opening in its associated recess and a generally flat top edge surface in abutment with said generally flat load bearing seating region within said housing to permit, upon alignment of the protruding contact portions with apertures in a substrate, the insulative housing to be used as a seating tool for press fitting the contacts into the apertures in a substrate and then be removed as a cover from around the contacts leaving them rigidly mounted into the substrate.

21. An electrical connector assembly adapted for structural mounting to a substrate having contact receiving apertures formed therein as set forth in claim 20 wherein said insulative housing serves as a locating stop as well as a seating tool for press-fitting the contacts into the apertures in a substrate.

22. An electrical connector comprising:

a mounting substrate having contact receiving apertures therein, said apertures forming arrays lying along linear paths;

an insulative housing having a plurality of sleeves formed therethrough in spaced alignment with said apertures, each of said sleeves being constructed with a lower portion which undercuts an upper portion to define a generally transversely extending shoulder therebetween; and longitudinally rigid contacts received into said sleeves through the lower portion thereof, said contacts each including a generally transversely extending, flat seating region which abuttingly engages said shoulder within said sleeve, said contacts also having a press-fit shank portion extending downwardly through said apertures and in interfering engagement therewith for securing said contacts tight and motionless therein and permitting said insulative housing to be removed from said contacts while said contacts remain frictionally mounted in said substrate.

23. An electrical connector as set forth in claim 22 wherein said contacts are held within the insulative housing sleeves by a retention force which is significantly less than the retention force holding the contacts within the apertures in said mounting substrate to permit removal of the insulator from around the contacts without disturbing the rigid mounting of the contacts within the substrate.

24. An electrical connector assembly adapted for structural mounting to a substrate having contact receiving apertures formed therein, comprising:
a removable insulative housing having a plurality of sleeves formed therethrough in spaced alignment with said lower apertures, each of said sleeves being constructed with a lower portion which undercuts an upper portion, said undercut forming a shoulder therebetween for receiving a contact mating portion, and
contacts received into said sleeves through the lower portion thereof, said contacts including a generally flat, transversely extending upper edge surface abuttingly engaging the shoulder of said sleeve, and a press-fitting shank portion beneath said collar portion for insertion and rigid mounting in the substrate, said contacts being held in position within the housing by frictional engagement with the inner walls of said sleeves to permit subsequent press-fitting of said contacts into apertures in the mounting substrate, said contacts being adapted for structural press-fit mounting by inserting the contacts into the apertures in the substrate and applying a downward force to said insulative housing to transmit press fit insertion forces from said insulative housing to said contacts through the abutting engagement of said contact upper edge surfaces and said sleeve shoulders and permit subsequent removal of said housing following rigid mounting of said contacts into the apertures in said substrate.

* * * * *